(12) United States Patent
Snider

(10) Patent No.: US 8,542,522 B2
(45) Date of Patent: Sep. 24, 2013

(54) NON-VOLATILE DATA-STORAGE LATCH

(75) Inventor: Gregory Stuart Snider, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 103 days.

(21) Appl. No.: 13/259,164

(22) PCT Filed: Jul. 23, 2009

(86) PCT No.: PCT/US2009/051564
§ 371 (c)(1),
(2), (4) Date: Sep. 23, 2011

(87) PCT Pub. No.: WO2011/011007
PCT Pub. Date: Jan. 27, 2011

(65) Prior Publication Data
US 2012/0014169 A1    Jan. 19, 2012

(51) Int. Cl.
*G11C 11/00*     (2006.01)
*G11C 13/00*    (2006.01)

(52) U.S. Cl.
CPC ................................. *G11C 13/0069* (2013.01)
USPC ........... 365/148; 365/100; 365/104; 365/154; 365/226; 365/233.1

(58) Field of Classification Search
CPC ........... G11C 13/0004; G11C 13/0028; G11C 2213/79; G11C 5/147; G11C 8/08; G11C 13/0007; G11C 11/56; G11C 11/5678; G11C 11/5685; G11C 13/004; G11C 13/0069; G11C 19/00; G11C 5/141

USPC .................... 365/148, 163, 226, 203, 230.06; 711/E12.099, 164
See application file for complete search history.

(56) References Cited

U.S. PATENT DOCUMENTS

| 2002/0129195 A1 | 9/2002 | Hongo et al. |
| 2005/0218952 A1 | 10/2005 | Padhye et al. |
| 2005/0219932 A1 | 10/2005 | Diorio et al. |
| 2008/0049489 A1* | 2/2008 | Johnson ........................ 365/158 |

FOREIGN PATENT DOCUMENTS

JP    63-181519    7/1988

* cited by examiner

Primary Examiner — Thong Q Le

(57) ABSTRACT

One embodiments of the present invention is directed to a single-bit memory cell comprising transistor-based bit latch having a data state and a memristor, coupled to the transistor-based bit latch, in which the data state of the transistor-based bit latch is stored by a store operation and from which a previously-stored data state is retrieved and restored into the transistor-based bit latch by a restore operation. Another embodiment of the present invention is directed to a single-bit memory cell comprising a master-slave flip flop and a slave flip flop, and a power input, a memristor, a memory-cell power input, a first memory-cell clock input, a second memory-cell clock input, a memory-cell data input, a memory-cell data output, and two or more memory-cell control inputs.

20 Claims, 15 Drawing Sheets

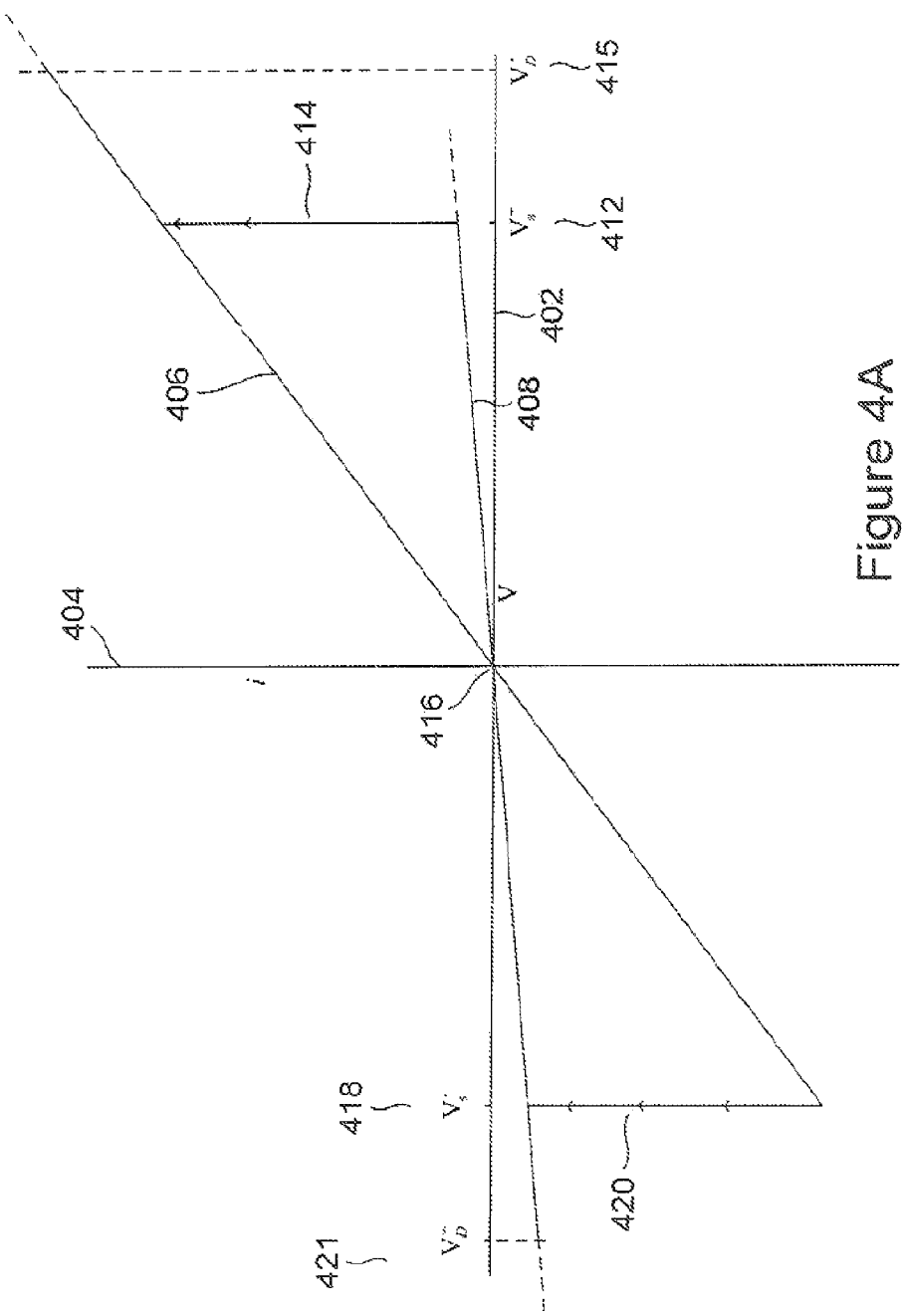

US 8,542,522 B2

NON-VOLATILE DATA-STORAGE LATCH

TECHNICAL FIELD

The present invention is related to electronic data storage and, in particular, to a data-storage unit, or memory cell, the state of which can be stored and subsequently restored despite power loss.

BACKGROUND OF THE INVENTION

A wide variety of different electronic data-storage methods have been used, and are currently used, in computer systems, telecommunications systems, and all manner of electronic device and appliances. Different types of electronic data-storage technologies offer different advantages. For example, magnetic-disk mass-storage devices provide cost-effective, extremely high-capacity, and non-volatile data storage, but provide relatively slow access times. By contrast, extremely high-speed processor registers within the central processing units ("CPUs") of computer systems provide fast access, but are characterized by high cost per bit of stored data and volatility. Designers, developers, and manufacturers of computer systems, telecommunications systems, and a wide variety of electronic devices and appliances generally devote significant time, financial resources, and effort to balancing the various advantages and disadvantages of different types of electronic memory in order to produce electronic systems with desired functionality and performance and with the lowest-possible cost, often using many different types of electronic data storage hierarchically organized within a particular system or device in order to obtain both fast access to stored data as well as cost-effective data storage with adequate capacity and at least partial data persistence, or non-volatility, over power-on and power-off cycles. Designers, developers, and manufacturers of computer systems, telecommunications equipment, and a wide variety of electronic appliances and devices continue to seek new types of electronic data-storage devices and technologies that provide useful characteristics and that can be added to the suite of currently existing devices and technologies in order to further flexibility in designing, developing, and manufacturing cost-effective, high-performance systems and devices.

BRIEF DESCRIPTION OF THE DRAWINGS

FIG. 4A illustrates operational characteristics of a memristor device.

DETAILED DESCRIPTION OF THE INVENTION

Embodiments of the present invention are directed to non-volatile electronic memory cells, or data-storage units, that can be quickly accessed, that are fabricated as components of integrated circuits, and that do not significantly increase power dissipation and heat generation during operation of the integrated circuits in which the non-volatile electronic memory cells are incorporated. One embodiment of the present invention is directed to a non-volatile master-slave D flip-flop ("MSDFF") into which a memristor device is incorporated to produce a memristor-enhanced MSDFF ("MEMSDFF") that can be used to instruct non-volatile registers and other non-volatile memory units within integrated circuits, including processors, that can be quickly accessed but do not significantly increase power consumption or heat generation.

Figure 1:
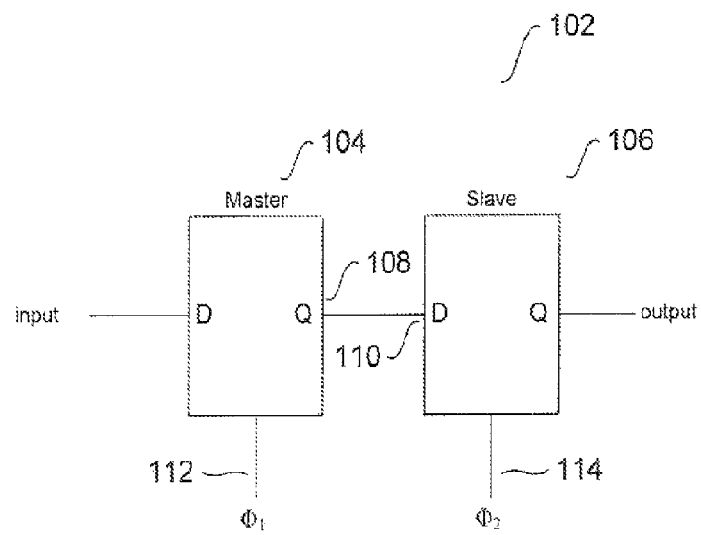
FIG. 1 provides a diagram for a master-slave D flip-flop.

FIG. 1 provides a diagram for a master-slave D flip-flop. The MSDFF 102 includes a master D flip-flop ("DFF") 104 and a slave DFF 106. The output Q 108 of the master DFF is coupled to the input D 110 of the slave DFF. The master DFF is controlled by a first clock signal $\Phi_1$ 112 and the slave DFF is controlled by a second clock signal $\Phi_2$. Both the master DFF and slave OFF receive input power signals, not shown in the diagram provided by FIG. 1. Both the master DFF and slave DFF are bistable crossed-inverter-based latches that can stably store two different states that represent the binary values "0" and "1," storing a single binary value at any instant in time. A single DFF can be used as a single-bit memory cell or data-storage unit, but the MSDFF device shown in FIG. 1 provides more robust storage of a binary value that is less susceptible to ambiguous data states due to feedback and imprecision in timing of input data and clock signals.

Figure 2:
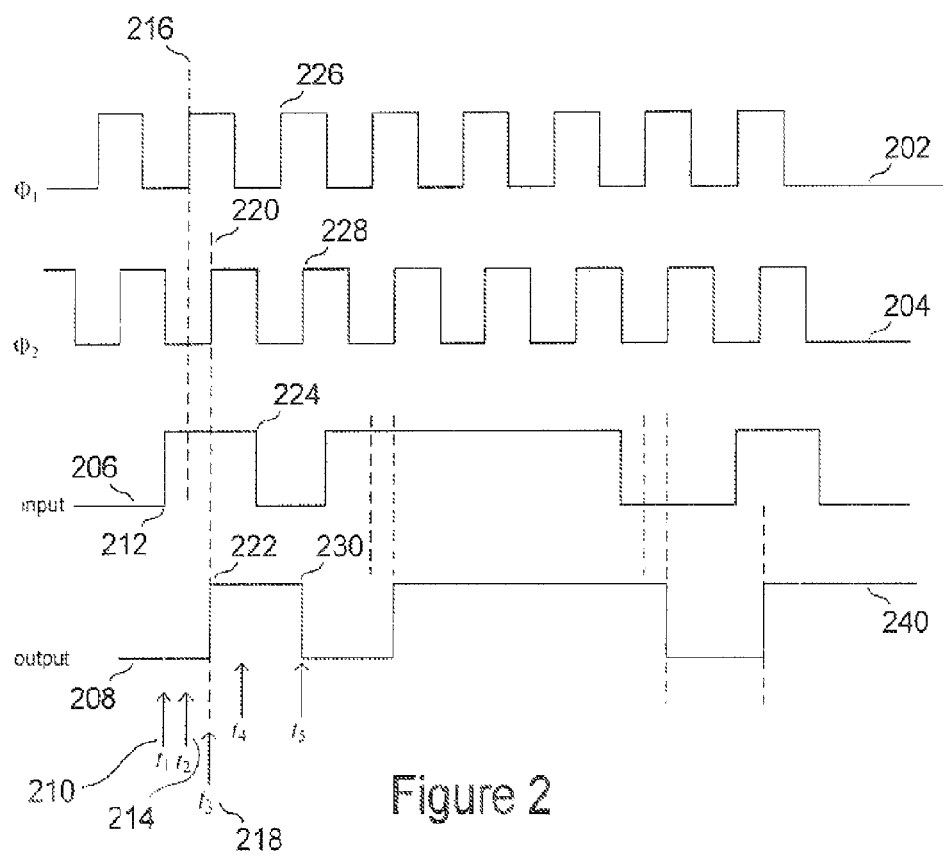
FIG. 2 illustrates operation of a master-slave D flip-flop.

FIG. 2 illustrates operation of a master-slave D flip-flop. FIG. 2 provides wave forms for the input, output, $\Phi_1$ and $\Phi_2$ signals of an MSDFF. The $\Phi_1$ and $\Phi_2$ s clock signals 202 and 204 feature regularly spaced pulses that are out of phase with one another. The wave forms in FIG. 2 are aligned with respect to an implied, horizontal time axis, and each waveform is graphed with respect to an implied, vertical, voltage axis. Initially, both the input signal 206 and output signal 208 are low. Initially, both the master DFF and slave DFF contain binary 0 values, where, by an arbitrary convention used in the current discussion, binary 0 corresponds to a low-voltage state and binary 1 corresponds to high-voltage state. At time $t_1$ 210, the input signal is driven high 212. At time $t_2$ 214, clock signal $\Phi_1$ transitions to a high-voltage state 216, causing the master DFF (104 in FIG. 1) to latch the binary value "1." At time $t_3$ 218, clock signal $\Phi_2$ transitions to a high-voltage state 220, latching in the slave OFF the output of the master DFF, which is now in a high-voltage state that reflects the binary 1 value latched by the master DFF as a result of the clock signal $\Phi_1$ transition at time $t_2$, resulting in the output signal transitioning to a high-voltage state 222. At time $t_4$, the input voltage falls back to 0 (224 in FIG. 2), and the binary value "0" is latched by the master DFF at the next rising edge of the $\Phi_1$ clock cycle 226. Binary value 0 is subsequently latched by the slave DFF at the next rising edge of the $\Phi_2$ clock cycle 228 into the slave DFF at time $t_5$, at which point the output signal falls back to a low-voltage state 230. Note that, as shown on the far right-hand side of FIG. 2, a binary value is stably stored in the MSDFF 240 in the absence of clock-signal transitions, as long as MSDFF remains powered. However, when the MSDFF is not powered, the stored data state is lost.

Figure 3:
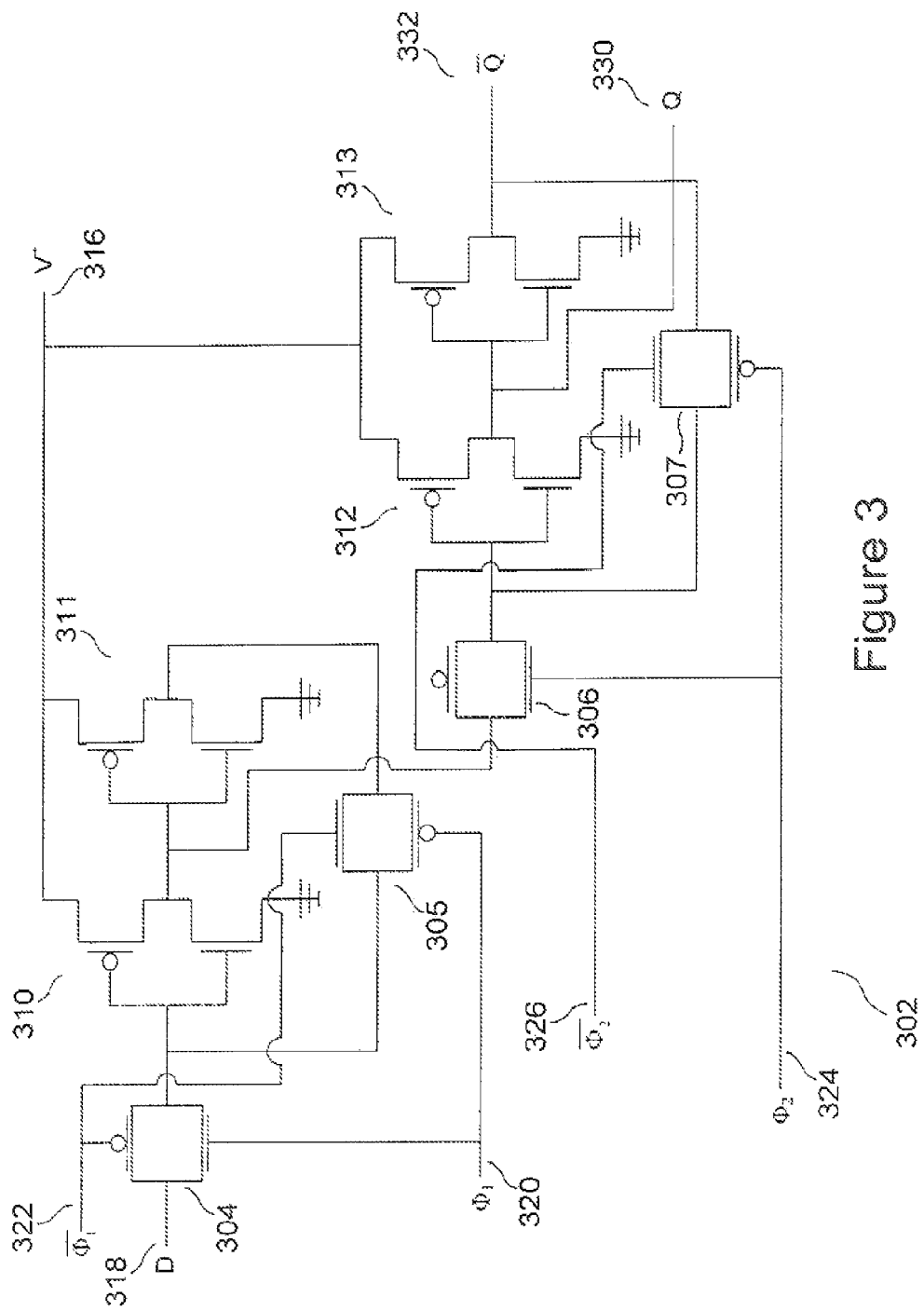
FIG. 3 shows a complementary-metal-oxide-semiconductor implementation of a master-slave D flip-flop.

FIG. 3 shows a complementary-metal-oxide-semiconductor implementation of a master-slave D flip-flop. The complementary-metal-oxide-semiconductor ("CMOS") implementation of the MSDFF 302 includes four CMOS transmission gates 304-307 and four CMOS inverters 310-313, each inverter comprising an nMOS and pMOS transistor pair. Inputs to the MSDFF include a power signal 316, an input data signal 318, complementary clock-signal pair $\Phi_1$ 320 and Φ₁ 322, and complementary clock-signal pair Φ₂ 324 and $\overline{\Phi}_2$ 326. Outputs include the complementary output signal pair Q 330 and $\overline{Q}$ 332. The master flip-flop comprises transmission gates 304 and 305 and inverters 310 and 311. The input signal D 318 is inverted by the first inverter 310 and input to the second inverter 311, which feeds back a twice-inverted input signal through transmission gate 305 to the first inverter. The two inverters thus constitute a positive feedback loop that latches the input signal. Transmission gate 305 blocks the feedback from the second inverter 311 during positive-voltage clock pulses, so that the input voltage does not compete with the feedback voltage during latching. The slave flip-flop comprises transmission gates 306 and 307 and inverters 312 and 313.

FIG. 4A illustrates operational characteristics of a memristor device. FIG. 4A provides a current versus voltage plot that describes the operational characteristics of a memristor device. Voltage is plotted with respect to a horizontal axis 402 and current is plotted with respect to a vertical axis 404. A memristor device has two different, stable impedance or resistance states, a low resistance state lowR corresponding to the current-vs.-voltage line segment 406 and a high impedance or high resistance state highR corresponding to the current-vs.-voltage line segment 408. When the memristor device is in the highR state, voltage increases positively up to a voltage $V_s^+$ 412 with relatively small increase in current. At voltage $V_s^+$, the memristor device transitions 414 to the lowR state, accompanied by a rapid increase in current transmission by the memristor device. Were voltage to continue to be increased, a voltage $V_D^+$ 415 is reached at which the current through the memristor device is too high, and the memristor device fails. When the voltage across the memristor device, in the state lowR, is decreased, current correspondingly decreases and, passing through the origin 416, begins to increases in a negative direction as the voltage is increased in the negative direction until the negative voltage $V_s^+$ 418 is reached, at which point the memristor device transitions from the lowR state to the highR state 420, with a rapid decrease in current transmission. Were the voltage continued to be decreased, a negative voltage $V_D^-$ 421 would be reached, at which point the memristor device would fail.

Impedance or resistivity states in a memristor device stably store a single bit of data. The data state of the memristor device can be read by dropping a positive or negative voltage across a memristor device, of magnitude less than $|V_s^+|$ and measuring the current that flows through the device. A large current flow indicates that the memristor device is in the lowR state, and a small current flow indicates that the memristor device is in the highR state. The data state of the memristor device can be set by dropping a positive voltage across the device greater than $V_s^+$ and less than $V_D^+$, to place the memristor device into the lowR state, or dropping a negative voltage across the device less than $V_s^-$ but greater than $V_D^-$, to place the memristor device into the highR state. Assignment of binary value to impedance or resistivity state is arbitrary. In an embodiment discussed below, the state lowR corresponds to binary value "1" and the state highR corresponds to the binary value "0."

Memristor devices can be fashioned using many different materials and structures, including tin oxide layered on a conductive or semi-conductive material. Descriptions of memristor devices and their fabrication are available in the literature.

Figure 4B:
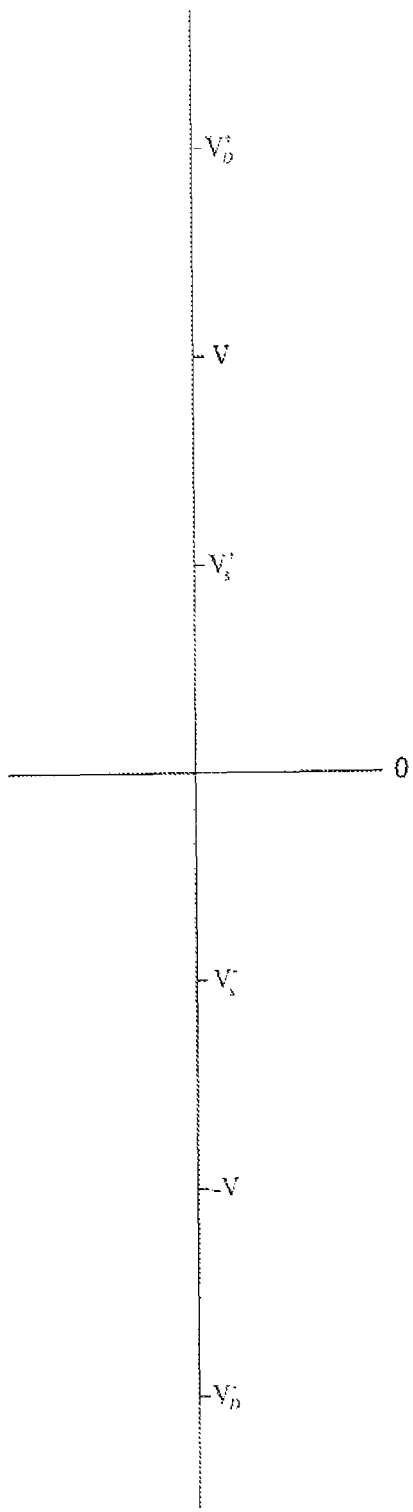
FIG. 4B illustrates the relative magnitudes of voltages $V_D^+$, $V_s^+$, $V_s^-$, and $V_D^-$ with respect to a system voltage V that drives a circuit containing the memristor device.

FIG. 4B illustrates the relative magnitudes of voltages $V_D^+$, $V_s^+$, $V_s^-$, and $V_D^-$, with respect to a system voltage V that drives a circuit containing the memristor device. The magnitudes $|V_s^+|$ and $|V_s^-|$ are approximately $$\frac{|V|}{2},$$

and the magnitudes $|V_D^+|$ and $|V_D^+|$ are both significantly greater than $|V|$. Different relative magnitudes of the circuit-driving voltage and characteristic memristor-device voltages $V_D^-$, $V_s^+$, $V_s^-$, and $V_D^-$ can be used in alternative embodiments of the present invention. Note that the system voltage is sufficient to change the state of a memristor device, in the embodiment of the present invention discussed below, but insufficient to cause the memristor device to fail.

Figure 5:
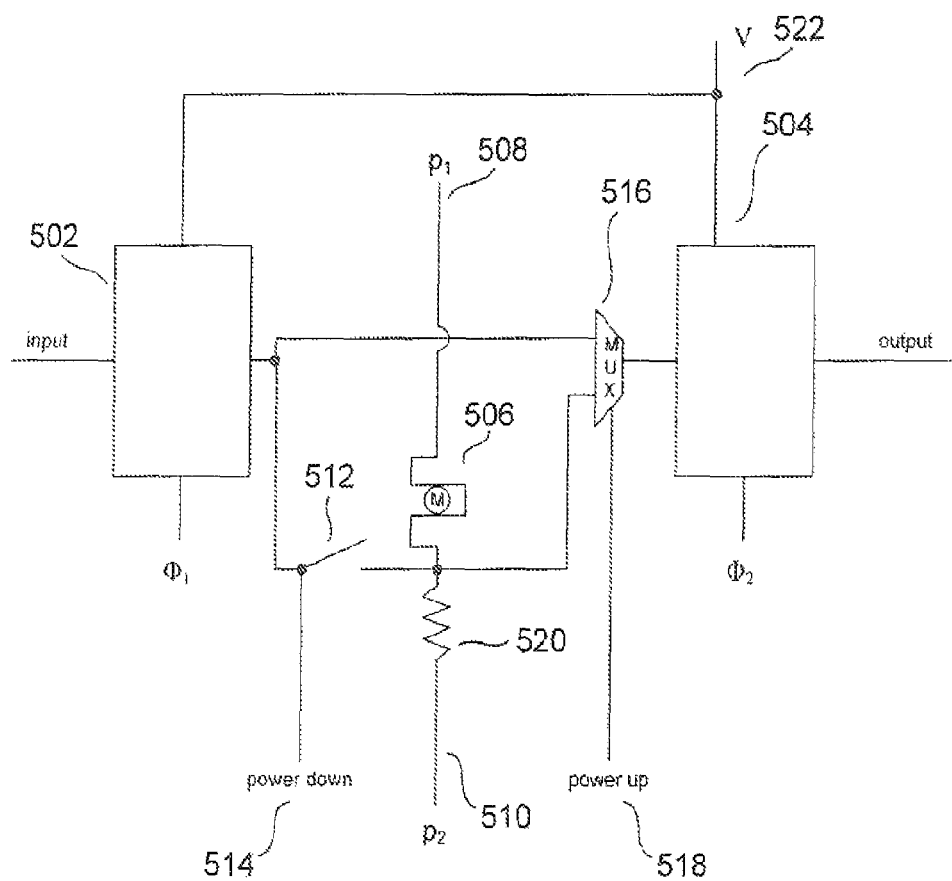
FIG. 5 illustrates a memristor-enhanced master-slave D flip-flop that represents one embodiment of the present invention.

FIG. 5 illustrates a memristor-enhanced master-slave D flip-flop that represents one embodiment of the present invention. As shown in FIG. 5, the MEMSDFF that represents one embodiment of the present invention includes a master DFF 502, a slave DFF 504, a memristor device 506 driven by signals $p_1$ 508 and $p_2$ 510, a switch 512 controlled by a power-down signal 514, and a 2:1 multiplexor ("MUX") 516 controlled by a power-up selection signal 518. The MEMSDFF that represents one embodiment of the present invention further includes a resistor 520 and a power input 522 that is routed to both the master DFF and slave DFF.

Figure 6A:
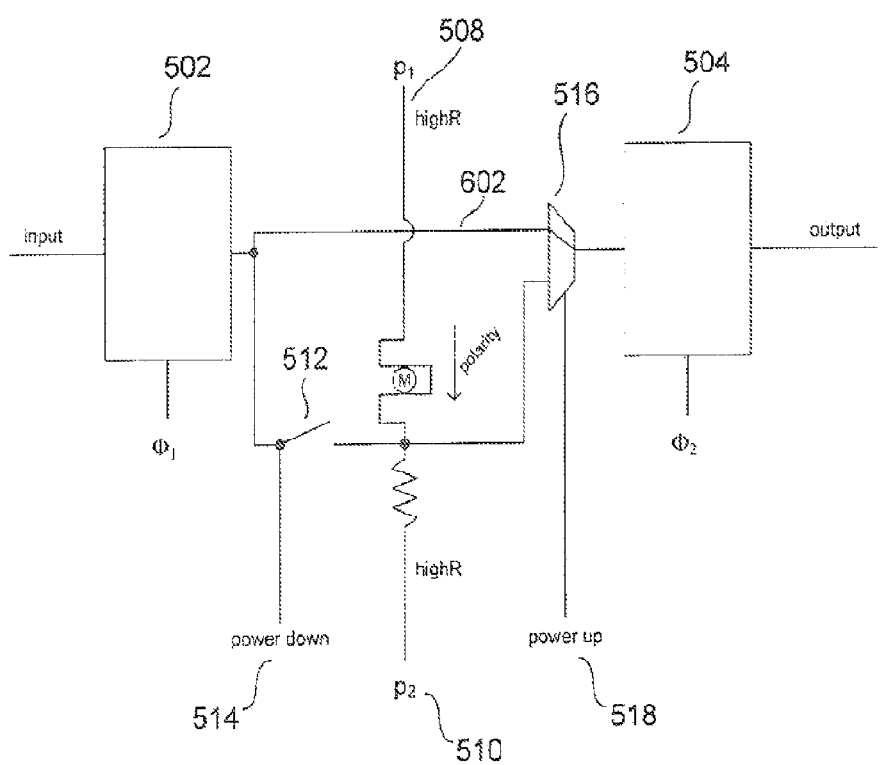
FIGS. 6A-H illustrate operation of the MEMSDFF that represents one embodiment of the present invention.

FIGS. 6A-H illustrate operation of the MEMSDFF that represents one embodiment of the present invention. FIG. 6A illustrates a normal, operational state of the MEMSDFF memory cell that represents one embodiment of the present invention. During normal operation, both the $p_1$ 508 and $p_2$ 510 inputs are in high-impedance states, the power-down signal 514 not asserted, as a result of which switch 512 is open, and the MUX is selected, as a result of the power-up signal 518 not asserted, to pass output from the master DFF 502 for input to the slave OFF 504. Switch 512 may, for example, be an nMOS transistor gated by the power-down signal and MUX 516 may be a simple two-input CMOS multiplexor fabricated from two CMOS transmission gates. During normal operation, the MEMSDFF that represents one embodiment of the present invention is equivalent to an MSDFF, with the memristor device essentially isolated electronically from the master DFF and slave DFF and with no power drawn by the memristor device or the circuitry that incorporates the memristor device into the MEMSDFF.

Figure 6B:
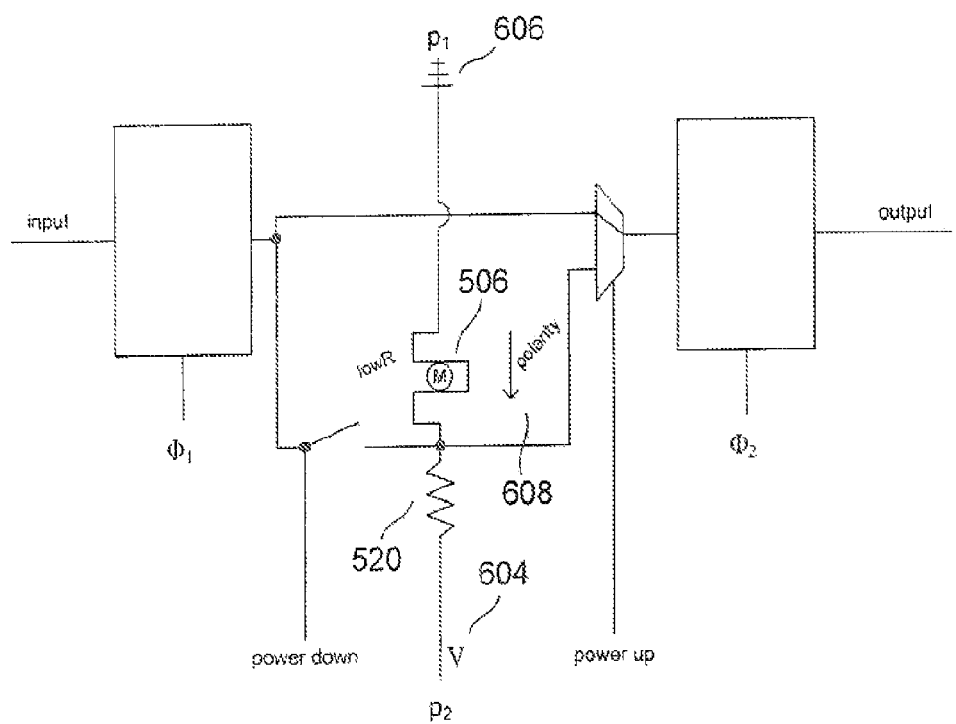

FIGS. 6B-E illustrate capture of the data state of the MEMSDFF that represents one embodiment of the present invention during a power-down sequence. When a power-failure event is detected in a system that includes the MEMSDFF, a power-down state machine is activated to carry out a sequence of inputs to the MEMSDFF that capture the data state of the MEMSDFF as a stable resistance or impedance state of the memristor device. First, as shown in FIG. 6B, system voltage V is applied to input $p_2$ 604 and input $p_1$ is connected to ground 606. The memristor device 506 has a polarity 608 such that a large voltage drop from $p_2$ to $p_1$ across the device sets the memristor in a lowR state, corresponding to transition 414 in FIG. 4. Note that the memristor device 506 and resistor 520 form a voltage divider. The resistor 520 has a resistance approximately equal to the average of the resistances of the lowR and highR states of the memristor device 506. Therefore, when system voltage V is applied to input $p_2$ and $p_1$ is connected to ground, as shown in FIG. 6B, then, when the memristor device 506 is in the highR state, the resistance of the memristor device is substantially greater than the resistance of resistor 520, so that the bulk of the voltage drop from signal $p_2$ to signal $p_1$ falls across the memristor device. Therefore, the voltage drop across the memristor device is greater than $V_s^+$, but less than V (see FIG. 4B), resulting in transition of the memristor device to the lowR state. When the memristor is in a lowR state, by contrast, the bulk of the voltage drop occurs across resistor 520, so that only a relatively low voltage drop occurs across the memristor device, and the memristor device remains in the lowR state. Thus, the power-down state machine, in a first step shown in FIG. 6B, sets the memristor device to state lowR.

Figure 6C:
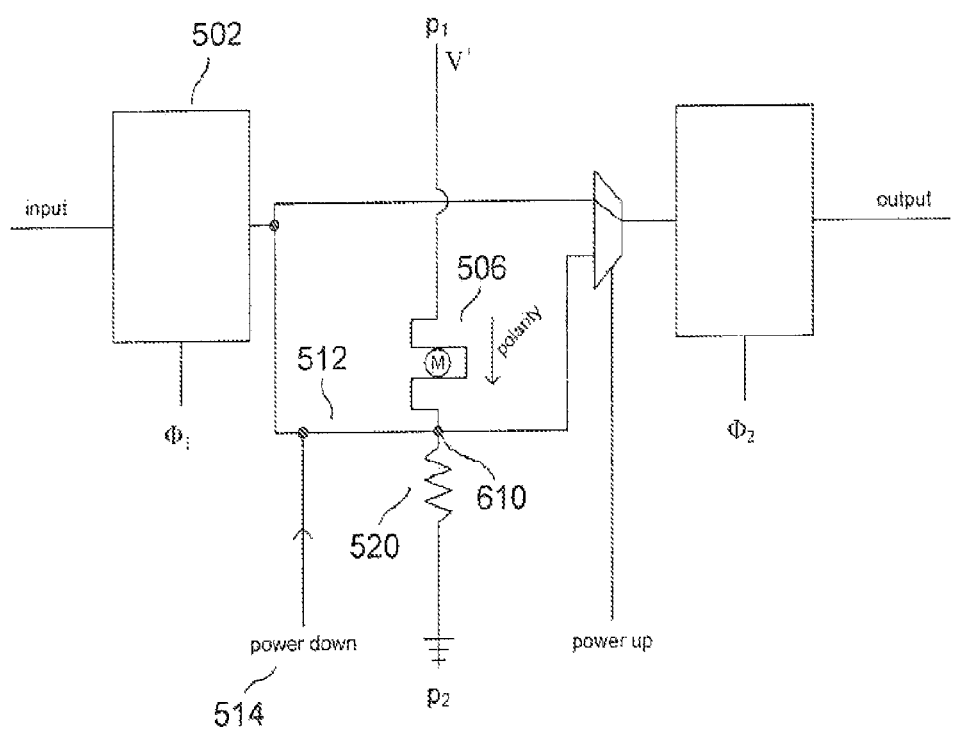
Figure 6D:
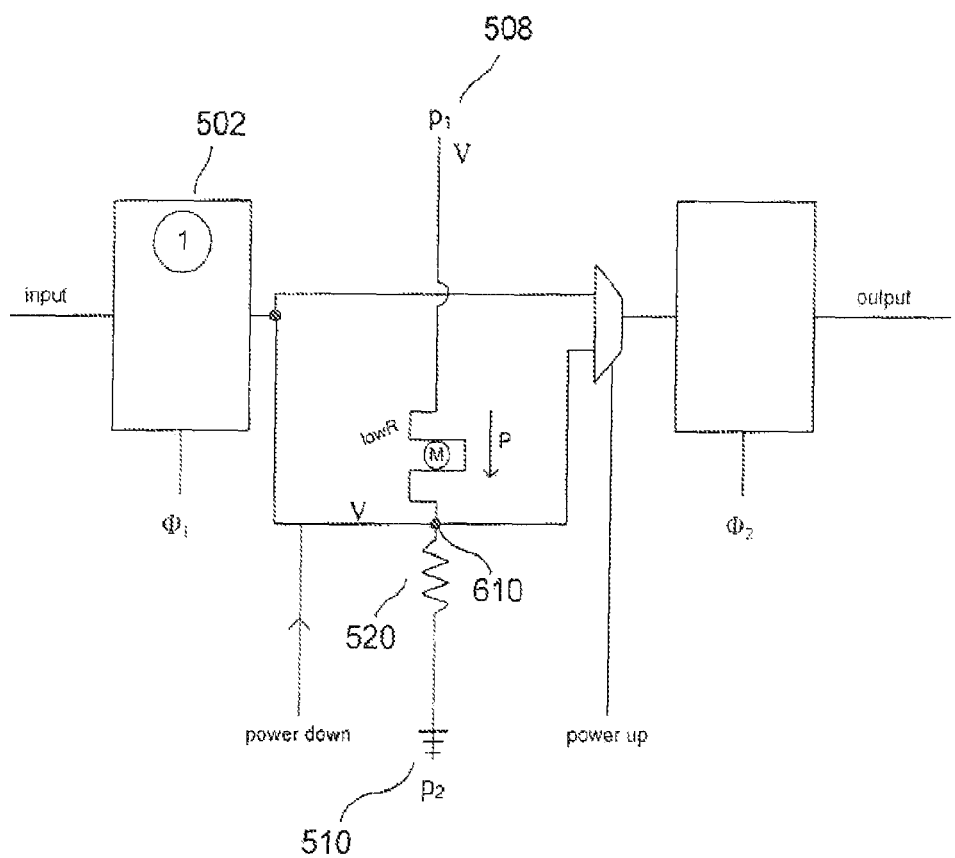
Figure 6E:
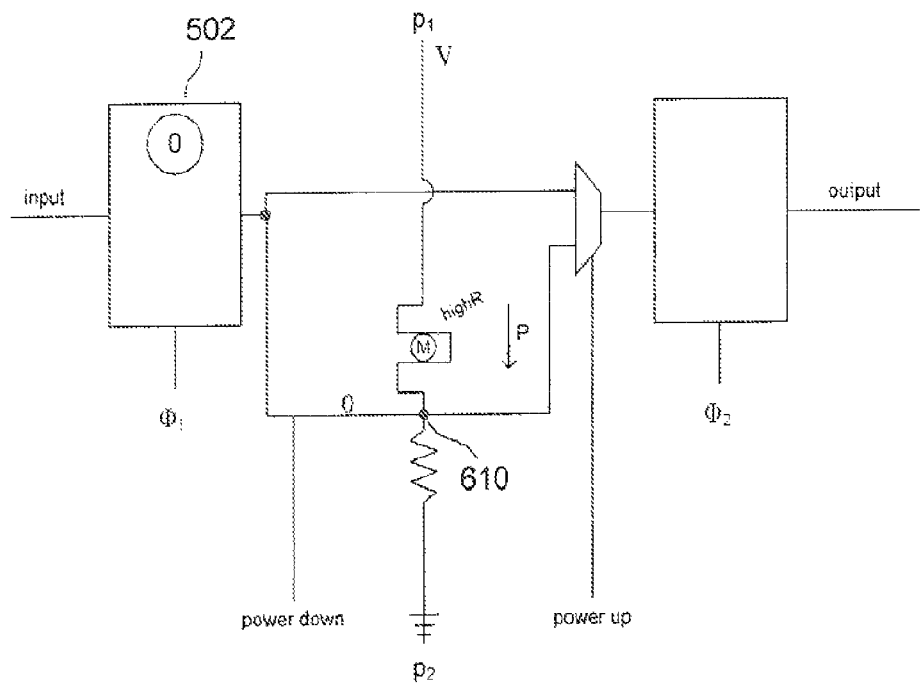

Next, as shown in FIG. 6C, the power-down signal 514 is asserted, closing switch 512 and connecting the output of the master DFF 502 with circuit point 610 between the memristor device 506 and resistor 520. At the same time, system voltage V is applied to input $p_1$ 508 and input $p_2$ 510 is connected to ground. When the master DFF currently has latched Boolean value "1," as shown in FIG. 6D, then circuit point 610 is brought to voltage V, and no voltage drop occurs across the memristor device, while a voltage drop of magnitude |V| occurs across resistor 520. Thus, the memristor device remains in state lowR, which reflects binary value "1" currently latched in the master DFF 502. By contrast, as shown in FIG. 6E, when the master DFF currently latches binary value "0," then circuit point 610 is placed at voltage 0, so that a large negative voltage is dropped across the memristor, resulting in a transition of the memristor from the state lowR to the state highR, corresponding to transition 420 in FIG. 4. Thus, as a result of the power-down sequence, the data state latched in the master DFF is captured in the memristor device, with latched binary value "0" corresponding to memristor-device state highR and latched binary value "1" corresponding to memristor-device state lowR.

Figure 6F:
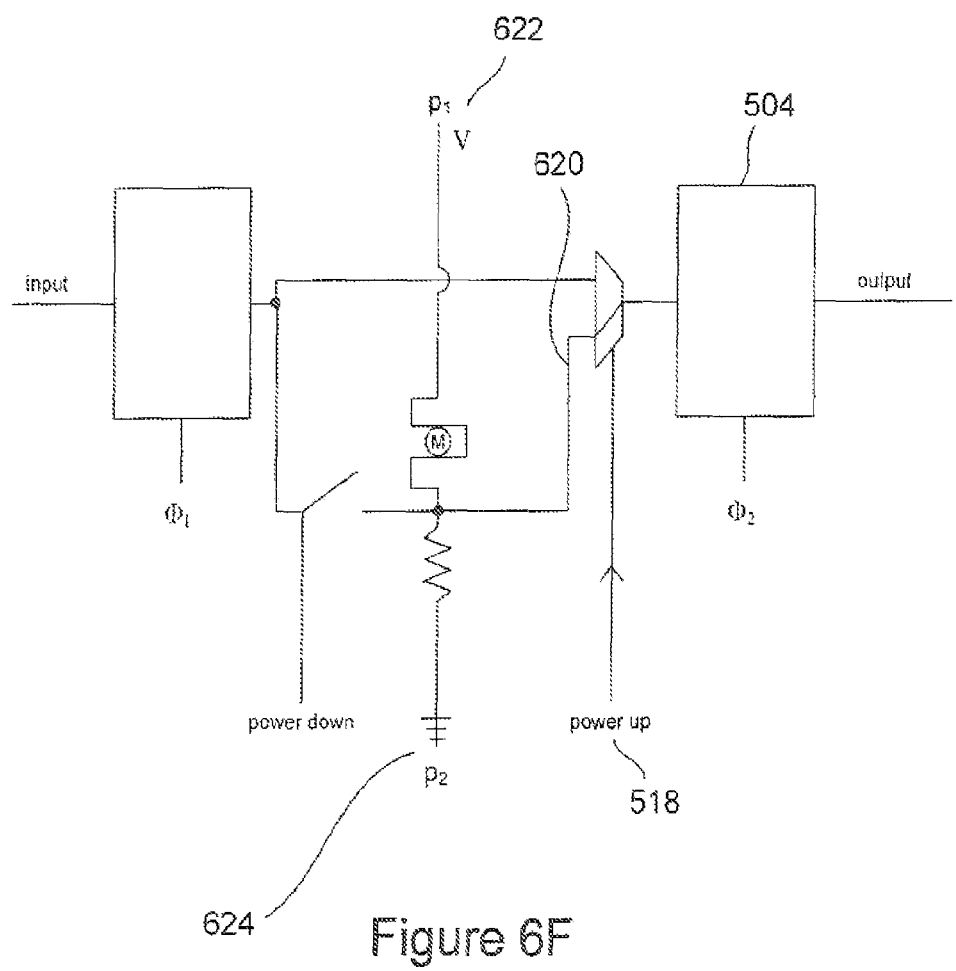
Figure 6G:
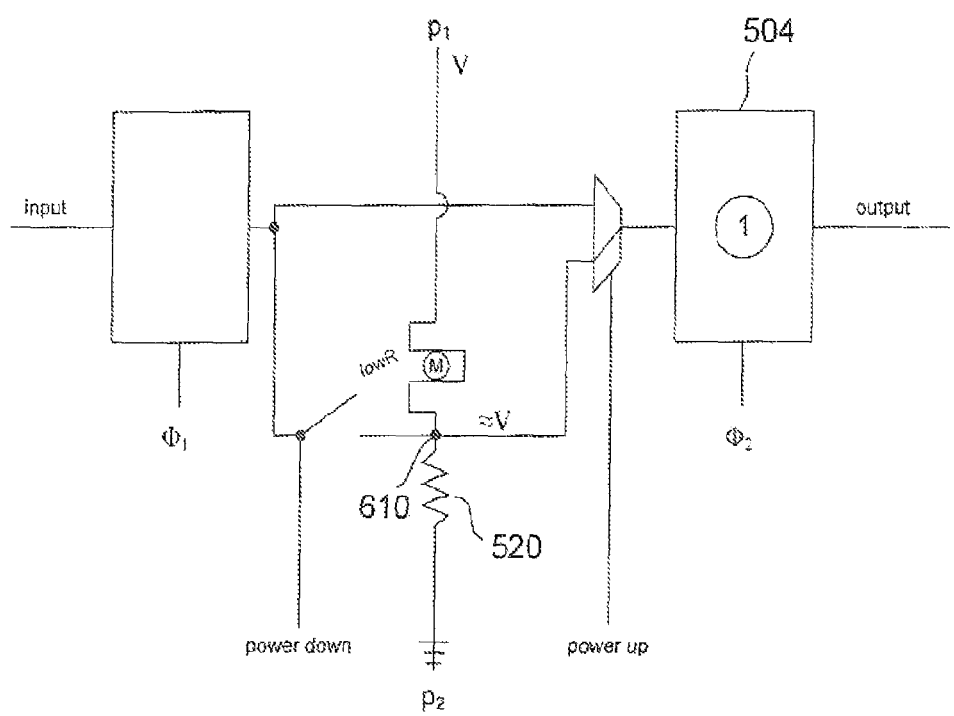
Figure 6H:
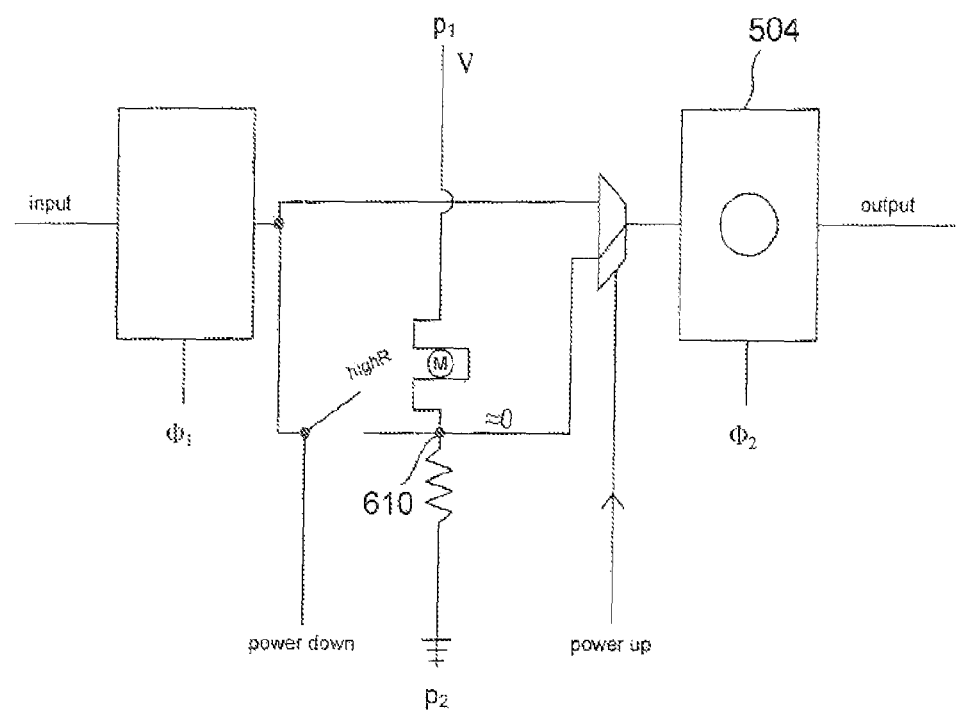

FIGS. 6F-H illustrate a power-up sequence that restores the data state of a MEMSDFF from the resistance state of the memristor device, according to one embodiment of the present invention. The power-up sequence involves asserting the power-up signal 518 to select signal line 620 for input to the slave DFF 504 as well as applying system voltage V to signal $p_1$ 622 and connecting signal $p_2$ to ground 624. When the memristor device is in a lowR state, as shown in FIG. 6G, corresponding to captured binary value "1," the bulk of the voltage drop from $p_1$ to $p_2$ occurs across resistor 520, so that circuit point 610 is near system voltage V. Clock signal $\Phi_2$ is then asserted to store binary value "1" in the slave DFF 504. By contrast, when the memristor device is in the highR state, as shown in FIG. 6H, the bulk of the voltage drop from $p_1$ to $p_2$ falls across the memristor device, so that circuit point 610 is close to 0 V. By asserting clock signal $\Phi_2$, binary value "0" is latched into the slave DFF 504.

There are many different types of flip-flop-based memory cells, and alternative embodiments of the present invention incorporate memristor devices into these different types of flip-flop-based memory cells in order to capture the state of the flip-flop-based memory cell, during a power-down sequence, and restore the state of the flip-flop-based memory cell, during a subsequent power-on sequence. The circuit elements, connections, and applied voltages may differ, with different flip-flop types, in order to achieve data-state capture and data-state restoration as discussed above, with reference to FIGS. 5 and 6A-H, for the master-slave D flip-flop-based memory cell. In addition, the transition voltages and breakdown voltages for the memristor device may differ from those described, above, for the MEMSDFF discussed with reference to FIG. 5 and FIGS. 6A-H, and a different circuit configuration and different applied voltages may therefore be needed in order to achieve MSDFF-data-state capture and MSDFF-data-state restoration.

Figure 7:
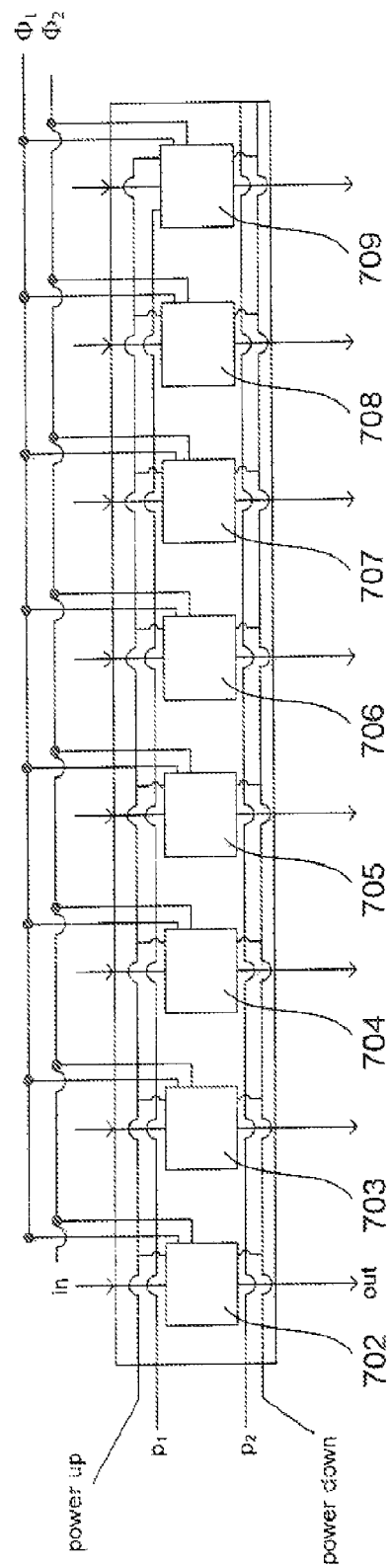
FIG. 7 illustrates an eight-bit non-volatile memory register fabricated from MEMSDFFs that represents embodiments of the present invention.

FIG. 7 illustrates an eight-bit non-volatile memory register fabricated from MEMSDFFs that represents embodiments of the present invention. In FIG. 7, eight MEMSDFF cells 702-709 are arranged in an array, and share common power-up, power-down, $p_1$, $p_2$, and $\Phi_1$ and $\Phi_2$ clock signals. Thus, all eight MEMSDFF cells 702-709 are synchronously controlled, for normal operation as well as for power-down, data-state-capture and power-up, data-state-restoration sequences. MEMSDFF devices that represent embodiments of the present invention can be combined to create arbitrarily sized arrays of one, two, or more dimensions in order to fabricate a wide variety of different types of memory elements, including arbitrarily wide memory registers and two-dimensional memory arrays of arbitrary dimensions.

Figure 8:
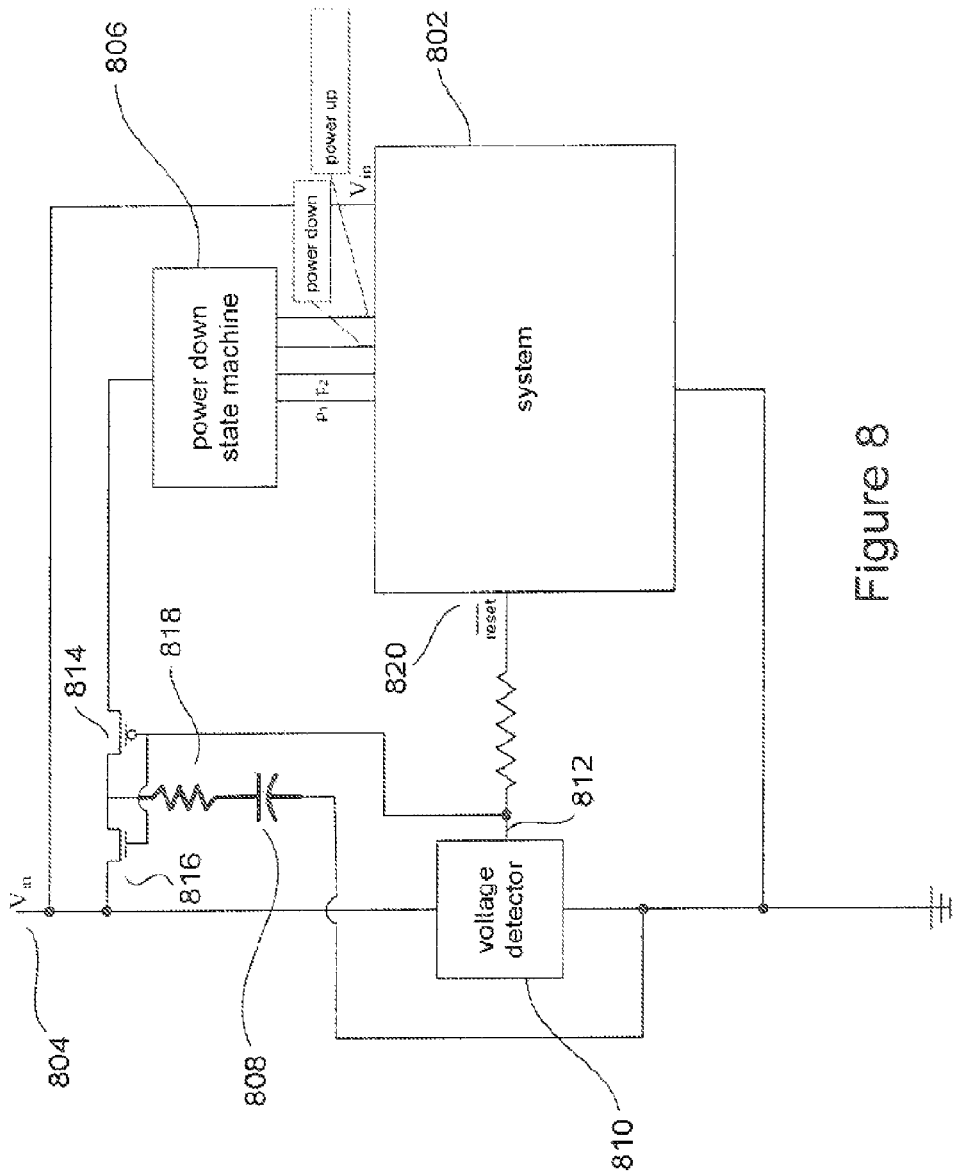
FIG. 8 illustrates a power-failure-tolerant system that represents one embodiment of the present invention.

FIG. 8 illustrates a power-failure-tolerant system that represents one embodiment of the present invention. In FIG. 8, an electronic system 802 is powered by an input voltage 804. The system is made power-failure tolerant by the addition of a power-down state machine 806, capacitor 808, and voltage detector 810. During normal operation, the input voltage is above a threshold value, as a result of which the voltage detector outputs a high-voltage signal 812 that closes transistor 814 and opens transistor 816, initially shunting a portion of input current to capacitor 808, which charges over a number of RC time constants for the resistor-capacitor pair. When power fails, the voltage detector detects the lower power and de-asserts the output signal 812, simultaneously forcing system reset 820, closing transistor 816, and opening transistor 814 to discharge stored charge in the capacitor 808 to the power-down state machine 806, which carries out the power-down sequence, discussed above with reference to FIGS. 6A-E, to capture the data state of all non-volatile memory elements within the system within the memristor devices incorporated into those memory elements, according to the present invention. In addition, the power-down state machine may set a particular value in a non-volatile register to indicate that a power-failure state-capture event has occurred. Subsequently, when power is restored to the system, a power-up routine may access this non-volatile register to determine whether or not to carry out a power-on initialization, in the case that a power-failure state-capture event has not occurred, or resume execution by employing a power-up sequence discussed above with reference to FIGS. 6D-H, in order to restore the state of all non-volatile memory elements from memristor devices incorporated into those non-volatile memory elements according to the present invention.

One application for the non-volatile memory elements of the present invention is low-power autonomous sensor devices that may be distributed through an environment. Such sensors normally depend on environmental power sources, which can be intermittent. By using the memristor-enhanced memory elements of the present invention and a power-down and power-up state machine, as discussed with reference to FIG. 8, the sensor devices can automatically store and restore state during intermittent power failures and subsequent power-resumption events to provide computationally consistent operation of the sensor over multiple power-failure and subsequent power-resumption events. Embodiments of the present invention may be used for computer-system CPUs and other subcomponents to allow for automatic power-on data-state restoration. Many other applications are possible.

Although the present invention has been described in terms of particular embodiments, it is not intended that the invention be limited to these embodiments. Modifications will be apparent to those skilled in the art. For example, as discussed above, memristor devices can be incorporated into any number of different types of flip-flop-based memory cells and into memory cells of different architectures. The number, type, and organization of circuit elements, in addition to the memristor device, incorporated into memristor-enhanced memory cells may vary, depending on the base type of memory cell and the characteristics of the memristor devices. In addition, different power-down and power-up sequences may be needed in order to effect state capture and state restoration in the various different types of memristor-enhanced memory cells.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings: The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A single-bit memory cell comprising:
   a transistor-based bit latch having a data state; and
   a memristor, coupled to the transistor-based bit latch, in which the data state of the transistor-based bit latch is stored by a store operation and from which a previously-stored data state is retrieved and restored into the transistor-based bit latch by a restore operation.

2. The single-bit memory cell of claim 1 wherein the data state of the transistor-based bit latch is stored as an impedance state in the memristor.

3. The single-bit memory cell of claim 1 further including at least two input signals to which control signals are input in order to store the current data state of the transistor-based bit latch in the memristor.

4. The single-bit memory cell of claim 1 further including at least two input signals to which control signals are input in order to restore the data state of the transistor-based bit latch from a data state stored in the memristor.

5. A memory element comprising two or more single-bit memory cells of claim 1.

6. The single-bit memory cell of claim 1, further comprising a power-down state machine that is activated by detecting a power-failure event, said power-down state machine, when activated by detecting a power-failure event, capturing a current data state of said transistor-based bit latch as a corresponding resistance level in said memristor.

7. A single-bit memory cell comprising:
   a master-slave flip flop comprising a master flip flop and a slave flip flop, each of the master flip flop and slave flip flop having a data input, a data output, a clock input, and a power input;
   a memristor;
   a memory-cell power input;
   a first memory-cell clock input;
   a second memory-cell clock input;
   a memory-cell data input;
   a memory-cell data output; and
   two or more memory-cell control inputs.

8. The single-bit memory cell of claim 7 wherein the two or more memory-cell control inputs include:
   a power-up input;
   a power-down input;
   a $P_1$ input; and
   a $P_2$ input.

9. The single-bit memory cell of claim 8 wherein:
   the memory-cell data input is coupled to the data input of the master flip flop;
   the memory-cell data output is coupled to the data output of the slave flip flop;
   the memory-cell power input is coupled to the power input of the master flip flop and to the power input of the slave flip flop
   the first memory-cell clock input is coupled to the clock input of the master flip flop;
   the second memory-cell clock input is coupled to the clock input of the slave flip flop;
   the data input of the slave flip flop is connected to the output of a multiplexer, a first input of which is connected to the data output of the master D flip flop, the multiplexer controlled by the power-up input;
   the memristor is connected, on a first side, to the $P_1$ input and is connected, on a second side, through a circuit point and resistor to the $P_2$ input; and
   a switch, controlled by the power-down input, is connected to the data output of the master D flip flop, on a first side, and connected, on a second side, through the circuit point to a second input of the multiplexer.

10. The single-bit memory cell of claim 8 wherein a current data state of the master flip flop is saved in the memristor by:
    applying system voltage V to the $P_2$ input and connecting the $P_1$ input to ground; and
    while applying system voltage V to the $P_1$ input and connecting the $P_2$ input to ground, asserting power-down.

11. The single-bit memory cell of claim 8 wherein a data state stored in the memristor is restored to the of the slave flip flop by:
    while applying system voltage V to the $P_1$ input and connecting the $P_2$ input to ground, asserting the power-up input and asserting the clock input to the slave flip flop.

12. The single-bit memory cell of claim 8 that operates normally when:
    the $P_2$ and the $P_1$ are both in high-impedance states; and
    the power-down and power-up inputs are not asserted.

13. The single-bit memory cell of claim 12 that, during normal operation:
    latches a data value input to the memory-cell data input when the second memory-cell clock is asserted following assertion of the first memory-cell clock and outputs the latched data value to the memory-cell data output.

14. A memory element comprising two or more memory cells of claim 8 that share a common first memory-cell clock input; second memory-cell clock input; power-up input; power-down input; $P_1$ input; and $P_2$ input.

15. A system that includes memory elements of claim 14.

16. The system of claim 15 further including a capacitor or battery charged by a power input that, when the system power input falls below a threshold voltage, discharges into a power-down state machine that stores the data states of the memory cells of the memory elements into memristors incorporated into the memory cells.

17. The system of claim 15 further including power-up logic that:
    determines whether or not, on a previous power down, the data states of the memory cells of the memory elements were stored into memristors incorporated into the memory cells; and
    when, on a previous power down, the data states of the memory cells of the memory elements were stored into memristors incorporated into the memory cells, restores the data states stored in the memristors of the memory cells into the memory cells.

18. The single-bit memory cell of claim 6, wherein, when activated by detecting a power-failure event, said power-down state machine sets a resistance level of said memristor to a low state and then maintains or changes that resistance level of said memristor based on said current data state of said transistor-based bit latch.

19. The single-bit memory cell of claim 6, further comprising a capacitor for storing charge with which said power-down state machine powers capture of said current data state of said transistor-based bit latch as a corresponding resistance level in said memristor in response to detection of a power-failure event.

20. A method of storing data in a single-bit memory cell comprising:
- selectively storing either of two data states with a transistor-based bit latch; and
- storing a current data state of said transistor-basted bit latch with a memristor coupled to the transistor-based bit latch,
- such that a previously-stored data state is selectively retrieved and restored into the transistor-based bit latch from the memristor.

* * * * *

UNITED STATES PATENT AND TRADEMARK OFFICE
CERTIFICATE OF CORRECTION

| | |
|---|---|
| PATENT NO. | : 8,542,522 B2 |
| APPLICATION NO. | : 13/259164 |
| DATED | : September 24, 2013 |
| INVENTOR(S) | : Gregory Stuart Snider |

Page 1 of 1

It is certified that error appears in the above-identified patent and that said Letters Patent is hereby corrected as shown below:

In the Claims

In column 8, line 31, in Claim 11, delete "the of the" and insert -- the --, therefor.

In column 9, line 17, in Claim 20, delete "transistor-basted" and insert -- transistor-based --, therefor.

Signed and Sealed this
Eleventh Day of February, 2014

Michelle K. Lee
*Deputy Director of the United States Patent and Trademark Office*